US010903248B2

United States Patent
Bae et al.

(10) Patent No.: US 10,903,248 B2
(45) Date of Patent: Jan. 26, 2021

(54) THIN FILM TRANSISTOR ARRAY SUBSTRATE AND ORGANIC LIGHT-EMITTING DISPLAY APPARATUS INCLUDING THE SAME

(71) Applicant: Samsung Display Co., Ltd., Yongin-si (KR)

(72) Inventors: Hansung Bae, Yongin-si (KR); Wonkyu Kwak, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/203,874

(22) Filed: Nov. 29, 2018

(65) Prior Publication Data

US 2019/0237494 A1 Aug. 1, 2019

(30) Foreign Application Priority Data

Jan. 31, 2018 (KR) .................. 10-2018-0012342

(51) Int. Cl.
*H01L 27/12* (2006.01)
*H01L 27/32* (2006.01)
(Continued)

(52) U.S. Cl.
CPC ....... *H01L 27/1255* (2013.01); *G09G 3/3266* (2013.01); *G09G 3/3291* (2013.01);
(Continued)

(58) Field of Classification Search
None
See application file for complete search history.

(56) References Cited

U.S. PATENT DOCUMENTS 9,041,000 B2   5/2015  Jeon
9,373,652 B2   6/2016  Jin et al.
(Continued)

FOREIGN PATENT DOCUMENTS

KR   10-2014-0037715   3/2014
KR   10-2015-0010523   1/2015
(Continued)

OTHER PUBLICATIONS

Extended European Search Report dated Jun. 4, 2019, in European Patent Application No. 19152417.2.

*Primary Examiner* — Dung A. Le
(74) *Attorney, Agent, or Firm* — H.C. Park & Associates, PLC

(57) ABSTRACT

A thin film transistor array substrate includes a substrate, at least one thin film transistor, a capacitor, an interlayer insulating layer, and a node connection line. The at least one thin film transistor is on the substrate. The capacitor is on the substrate and includes: a bottom electrode on the substrate; a top electrode overlapping the bottom electrode, the top electrode including an opening having a single closed curve shape; and a dielectric layer between the bottom electrode and the top electrode. The interlayer insulating layer covers the capacitor. The node connection line is on the interlayer insulating layer and electrically connects the capacitor to the at least one thin film transistor. An overlapping area of the bottom electrode and the top electrode is divided by the opening into two separate areas.

20 Claims, 13 Drawing Sheets

(51) Int. Cl.
    *H01L 51/52*     (2006.01)
    *H01L 51/50*     (2006.01)
    *G09G 3/3266*     (2016.01)
    *G09G 3/3291*     (2016.01)

(52) U.S. Cl.
    CPC ........ *H01L 27/124* (2013.01); *H01L 27/3262* (2013.01); *H01L 27/3265* (2013.01); *H01L 27/3276* (2013.01); *H01L 51/5012* (2013.01); *H01L 51/5206* (2013.01); *H01L 51/5221* (2013.01); *H01L 51/5256* (2013.01); *G09G 2300/0439* (2013.01)

(56) References Cited

U.S. PATENT DOCUMENTS

| | | | |
|---|---|---|---|
| 2002/0096771 A1* | 7/2002 | Yamada | H01L 21/76829 257/758 |
| 2003/0053351 A1* | 3/2003 | Oh | G11C 11/22 365/200 |
| 2013/0105801 A1* | 5/2013 | Lee | H01L 21/268 257/59 |
| 2014/0077176 A1* | 3/2014 | Lee | H01L 27/3262 257/40 |
| 2016/0099300 A1 | 4/2016 | Lee et al. | |
| 2016/0104758 A1 | 4/2016 | Kim | |
| 2016/0260790 A1 | 9/2016 | Lee et al. | |
| 2017/0141172 A1 | 5/2017 | Cho et al. | |
| 2018/0006103 A1 | 1/2018 | Lee et al. | |

FOREIGN PATENT DOCUMENTS

| | | |
|---|---|---|
| KR | 10-2015-0059507 | 6/2015 |
| KR | 10-2016-0013341 | 2/2016 |

* cited by examiner

THIN FILM TRANSISTOR ARRAY SUBSTRATE AND ORGANIC LIGHT-EMITTING DISPLAY APPARATUS INCLUDING THE SAME

CROSS-REFERENCE TO RELATED APPLICATION

This application claims priority from and the benefit of Korean Patent Application No. 10-2018-0012342, filed Jan. 31, 2018, which is hereby incorporated by reference for all purposes as if fully set forth herein.

BACKGROUND

Field

One or more exemplary embodiments generally relate to display devices, and, more particularly, to a thin film transistor array substrate and an organic light-emitting display apparatus including the thin film transistor array substrate.

Discussion

An organic light-emitting display apparatus typically includes two electrodes and an organic emissive layer between the two electrodes. Electrons injected through one electrode and holes injected through the other electrode are combined in the organic emissive layer to create excitons that discharge energy to thereby emit light. Such an organic light-emitting display apparatus may include a plurality of pixels that include an organic light-emitting device, which is a self-emissive device. A plurality of thin film transistors and a capacitor are formed in each pixel to drive the organic light-emitting device. A need, however, exists to secure uniform performance of an organic light-emitting display apparatus and exhibiting uniform characteristics despite process errors.

The above information disclosed in this section is only for understanding the background of the inventive concepts, and, therefore, may contain information that does not form prior art.

SUMMARY

One or more exemplary embodiments are capable of providing a thin film transistor array substrate including a capacitor providing capacitance that is not sensitive to process deviation.

One or more exemplary embodiments are capable of providing an organic light-emitting display apparatus including a thin film transistor array substrate including a capacitor providing capacitance that is not sensitive to process deviation.

Additional aspects will be set forth in the detailed description which follows, and, in part, will be apparent from the disclosure, or may be learned by practice of the inventive concepts.

According to some exemplary embodiments, a thin film transistor array substrate includes a substrate, at least one thin film transistor, a capacitor, an interlayer insulating layer, and a node connection line. The at least one thin film transistor is on the substrate. The capacitor is on the substrate and includes: a bottom electrode on the substrate; a top electrode overlapping the bottom electrode, the top electrode including an opening having a single closed curve shape; and a dielectric layer between the bottom electrode and the top electrode. The interlayer insulating layer covers the capacitor. The node connection line is on the interlayer insulating layer and electrically connects the capacitor to the at least one thin film transistor. An overlapping area of the bottom electrode and the top electrode is divided by the opening into two separate areas.

In some exemplary embodiments, the opening may expose opposing ends of the bottom electrode in a direction.

In some exemplary embodiments, when viewed in a plan view, an edge of the top electrode may be outwardly spaced apart from an edge of the bottom electrode, the edge of the top electrode may surround the edge of the bottom electrode.

In some exemplary embodiments, the thin film transistor array substrate may further include a node contact hole in the opening and passing through the interlayer insulating layer and the dielectric layer. A first end of the node connection line may be connected to the bottom electrode through the node contact hole.

In some exemplary embodiments, when viewed in a plan view, a size of the opening may be greater than a size of the node contact hole.

In some exemplary embodiments, the thin film transistor array substrate may further include: a scanning line extending in a first direction and a data line extending in a second direction crossing the first direction. The opening may have a rectangular shape including a longer side in the first direction.

In some exemplary embodiments, the thin film transistor array substrate may further include: a scanning line extending in a first direction and a data line extending in a second direction crossing the first direction. The opening may have a rectangular shape including a longer side in the second direction.

In some exemplary embodiments, the thin film transistor array substrate may further include a driving voltage line in a same layer as the node connection line. A driving voltage may be transmitted via the driving voltage line. The top electrode may be connected to the driving voltage line through a contact hole.

In some exemplary embodiments, the thin film transistor array substrate may further include a driving thin film transistor overlapping the capacitor. The bottom electrode may form a driving gate electrode of the driving thin film transistor, the bottom electrode and the driving gate electrode being equivalent.

In some exemplary embodiments, a driving semiconductor layer of the driving thin film transistor may have a curved shape.

In some exemplary embodiments, the at least one thin film transistor may include a compensation thin film transistor, a first end of the node connection line may be connected to the bottom electrode, and a second end of the node connection line may be connected to a drain region of the compensation thin film transistor.

According to some exemplary embodiments, an organic light-emitting display apparatus includes a substrate, a driving voltage line, a scanning line, a data line, a pixel circuit, an interlayer insulating layer, and a node connection line. The driving voltage line is on the substrate. The driving voltage line is configured to transmit a driving voltage. The scanning line extends on the substrate in a first direction. The data line is insulated from the scanning line and extends in a second direction crossing the first direction. The pixel circuit electrically connects the driving voltage line, the scanning line, and the data line. The pixel circuit includes at least one thin film transistor and a capacitor. The capacitor includes: a bottom electrode on the substrate; a top electrode overlapping the bottom electrode, the top electrode including an opening having a single closed curve shape; and a dielectric layer between the bottom electrode and the top electrode. The interlayer insulating layer covers the capacitor. The node connection line is arranged on the interlayer insulating layer and electrically connects the capacitor to the at least one thin film transistor. An overlapping area of the bottom electrode and the top electrode is divided by the opening into two separate regions.

In some exemplary embodiments, the opening may expose opposing ends of the bottom electrode in a direction.

In some exemplary embodiments, when viewed in a plan view, an edge of the top electrode may be outwardly spaced apart from an edge of the bottom electrode, the edge of the top electrode may surround the edge of the bottom electrode.

In some exemplary embodiments, the organic light-emitting display apparatus may further include a node contact hole in the opening and passing through the interlayer insulating layer and the dielectric layer. A first end of the node connection line may be connected to the bottom electrode through the node contact hole.

In some exemplary embodiments, a size of the opening may be greater than a size of the node contact hole.

In some exemplary embodiments, the opening may extend in the first direction or the second direction.

In some exemplary embodiments, the driving voltage line may be in a same layer as the node connection line, and the top electrode may be connected to the driving voltage line through a contact hole.

In some exemplary embodiments, the at least one transistor may include a driving thin film transistor overlapping the capacitor, and the bottom electrode may form a driving gate electrode of the driving thin film transistor, the bottom electrode and the driving gate electrode may be a single unit.

In some exemplary embodiments, the at least one thin film transistor may further include a compensation thin film transistor, a first end of the node connection line may be connected to the bottom electrode, and a second end of the node connection line may be connected to a drain region of the compensation thin film transistor.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts.

DETAILED DESCRIPTION OF THE ILLUSTRATED EMBODIMENTS

Figure 1:
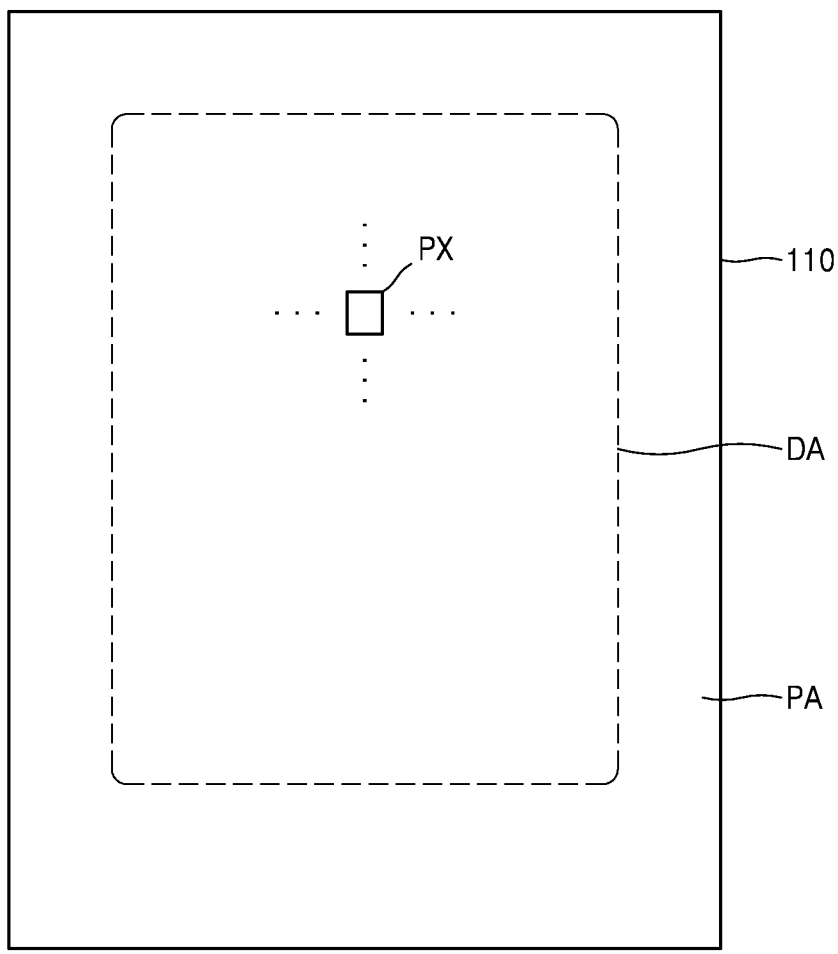
FIG. 1 is a schematic view of an organic light-emitting display apparatus according to some exemplary embodiments.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some exemplary embodiments. Therefore, unless otherwise specified, the features, components, modules, layers, films, panels, regions, aspects, etc. (hereinafter individually or collectively referred to as an "element" or "elements"), of the various illustrations may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element is referred to as being "on," "connected to," or "coupled to" another element, it may be directly on, connected to, or coupled to the other element or intervening elements may be present. When, however, an element is referred to as being "directly on," "directly connected to," or "directly coupled to" another element, there are no intervening elements present. Other terms and/or phrases used to describe a relationship between elements should be interpreted in a like fashion, e.g., "between" versus "directly between," "adjacent" versus "directly adjacent," "on" versus "directly on," etc. Further, the term "connected" may refer to physical, electrical, and/or fluid connection. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one element's relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. In this manner, regions illustrated in the drawings may be schematic in nature and shapes of these regions may not reflect the actual shapes of regions of a device, and, as such, are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

As customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the inventive concepts. Further, the blocks, units, and/or modules of some exemplary embodiments may be physically combined into more complex blocks, units, and/or modules without departing from the inventive concepts.

FIG. 1 is a schematic view of an organic light-emitting display apparatus according to some exemplary embodiments.

Referring to FIG. 1, the organic light-emitting display apparatus includes a display area DA and a peripheral area PA, which is a non-display area. A plurality of pixels PX including an organic light-emitting device (OLED) may be arranged in the display area DA to provide a determined image. The peripheral area PA does not provide an image, and includes a scan driver (see FIG. 2) and a data driver (see FIG. 2) and the like that provide an electrical signal to be applied to the pixels PX of the display area DA, and includes power lines through which power, such as a driving voltage and a common voltage is provided.

Figure 2:
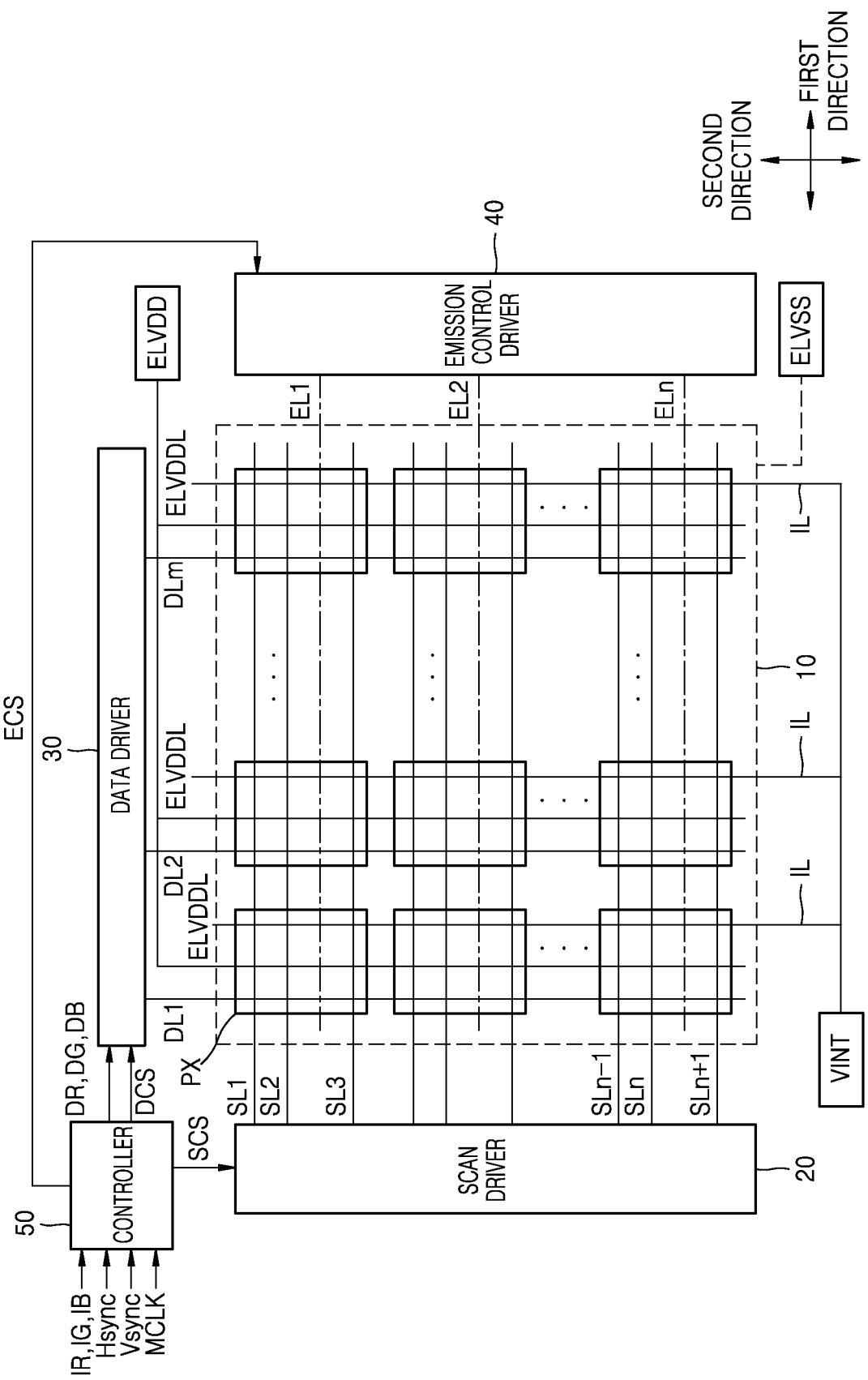
FIG. 2 is a schematic block diagram illustrating an organic light-emitting display apparatus according to some exemplary embodiments.

FIG. 2 is a schematic block diagram illustrating an organic light-emitting display apparatus according to some exemplary embodiments.

As seen in FIG. 2, the organic light-emitting display apparatus includes a display unit 10 including a plurality of pixels PX, a scan driver 20, a data driver 30, an emission control driver 40, and a controller 50.

The display unit 10 is arranged in a display area DA (see FIG. 1), and includes a plurality of pixels PX located at intersection portions of a plurality of scanning lines SL1 through SLn+1, a plurality of data lines DL1 through DLm, and a plurality of emission control lines EL1 through ELn. The pixels PX may be arranged approximately in a matrix form. The plurality of scanning lines SL1 through SLn+1 and the plurality of emission control lines EL1 through ELn extend in a first direction, which is a row direction, and the plurality of data lines DL1 through DLm and a driving voltage line ELVDDL extend in a second direction, which is a column direction. In one line, a value of "n" of the plurality of scanning lines SL1 through SLn+1 may be different from a value of "n" of the plurality of emission control lines EL1 through ELn.

Each of the pixels PX is connected to three scanning lines from among the plurality of scanning lines SL1 through SLn+1 extending to the display unit 10. The scan driver 20 generates at least three scanning signals and transmits the scanning signals to the pixels PX through the plurality of scanning lines SL1 through SLn+1. That is, the scan driver 20 sequentially supplies scanning signals to scanning lines SL2 through SLn, previous scanning lines SL1 through SLn−1, or subsequent scanning lines SL3 through SLn+1.

An initialization voltage line IL may receive an initialization voltage from an external power supply source VINT, and supply the initialization voltage to each of the pixels PX. In addition, each of the plurality of pixels PX is connected to one of the plurality of data lines DL1 through DLm connected to the display unit 10 and to one of the plurality of emission control lines EL1 through ELn connected to the display unit 10.

The data driver 30 transmits a data signal to each of the pixels PX through the plurality of data lines DL1 through DLm. Each time a scanning signal is supplied to the scanning lines SL2 through SLn, a data signal is supplied to a pixel selected by the scanning signal.

The emission control driver 40 generates an emission control signal and transmits the same to each of the pixels PX through the plurality of emission control lines EL1 through ELn. An emission time of each of the pixels PX is controlled by the emission control signal. The emission control driver 40 may be omitted depending on a structure (e.g., internal structure) of the pixels PX.

The controller 50 modifies a plurality of image signals IR, IG, and IB received from the outside into a plurality of image data signals DR, DG, and DB, and transmits the same to the data driver 30. In addition, the controller 50 receives a vertical synchronization signal Vsync, a horizontal synchronization signal Hsync, and a clock signal MCLK to respectively generate controls signals to control driving of the scan driver 20, the data driver 30, and the emission control driver 40, and transmits the control signals to the scan driver 20, the data driver 30, and the emission control driver 40. That is, the controller 50 generates a scan driving control signal SCS for controlling the scan driver 20, a data driving control signal DCS for controlling the data driver 30, and an emission driving control signal ECS for controlling the emission control driver 40, and transmits the control signals to the scan driver 20, the data driver 30, and the emission control driver 40, respectively.

Each of the plurality of pixels PX receives a driving power voltage ELVDD and a common power voltage ELVSS (see FIG. 3) from the outside. The driving power voltage ELVDD may be a determined high-level voltage, and the common power voltage ELVSS may be lower than the driving power voltage ELVDD or a ground voltage. The driving power voltage ELVDD is supplied to each of the pixels PX through the driving voltage line ELVDDL.

Each of the plurality of pixels PX emits light of a determined brightness according to a driving current supplied to a light-emitting device according to a data signal received through the plurality of data lines DL1 through DLm.

Figure 3:
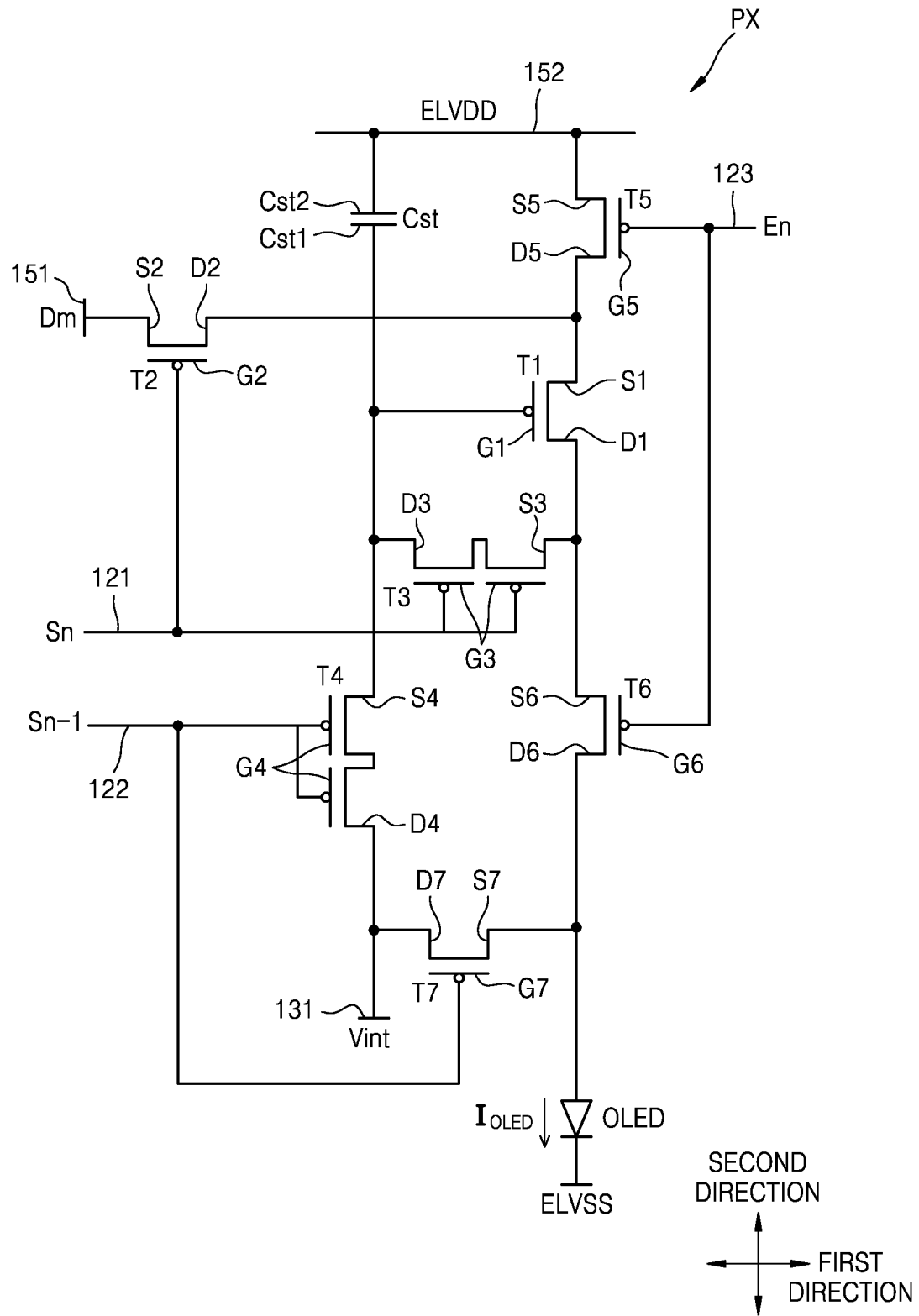
FIG. 3 is an equivalent circuit diagram of a pixel included in the organic light-emitting display apparatus of FIG. 1 according to some exemplary embodiments.

FIG. 3 is an equivalent circuit diagram of a pixel included in the organic light-emitting display apparatus of FIG. 1 according to some exemplary embodiments. It is noted that the pixel PX of FIG. 3 may be representative of the pixels PX of the organic light-emitting display apparatus of FIGS. 1 and 2.

Referring to FIG. 3, the pixel PX includes signal lines 121, 122, 123, and 151, a plurality of thin film transistors (TFTs) T1, T2, T3, T4, T5, T6, and T7, a capacitor Cst, an initialization voltage line 131, a driving voltage line 152, and an organic light-emitting device OLED.

Although all of the signal lines 121, 122, 123, and 151, the initialization voltage line 131, and the driving voltage line 152 are included in the one pixel PX in FIG. 3, the exemplary embodiments are not limited thereto. For instance, at least one of the signal lines 121, 122, 123, and 151 and/or the initialization voltage line 131 may be shared with one or more adjacent pixels.

The TFTs T1, T2, T3, T4, T5, T6, and T7 may include a driving TFT T1, a switching TFT T2, a compensation TFT T3, a first initialization TFT T4, an operation control TFT T5, an emission control TFT T6, and a second initialization TFT T7.

The signal lines 121, 122, 123, and 151 include a scanning line 121 through which a scan signal Sn is transmitted, a previous scanning line 122 through which a previous scanning signal Sn−1 is transmitted to the first initialization TFT T4 and the second initialization TFT T7, an emission control line 123 through which an emission control signal En is transmitted to the operation control TFT T5 and the emission control TFT T6, and a data line 151 which crosses the scanning line 121 and through which a data signal Dm is transmitted. A driving power voltage ELVDD is transmitted through the driving voltage line 152 to the driving TFT T1, and an initialization voltage Vint through which the driving TFT T1 and a pixel electrode are initialized is transmitted through the initialization voltage line 131.

A driving gate electrode G1 of the driving TFT T1 is connected to a first electrode Cst1 of the capacitor Cst, a driving source electrode S1 of the driving TFT T1 is connected to the driving voltage line 152 via the operation control TFT T5, and a driving drain electrode D1 of the driving TFT T1 is electrically connected to a pixel electrode of the organic light-emitting device OLED via the emission control TFT T6. The driving TFT T1 receives a data signal Dm according to a switching operation of the switching TFT T2 to supply a driving current $I_{OLED}$ to the organic light-emitting device OLED.

A switching gate electrode G2 of the switching TFT T2 is connected to the scanning line 121, a switching source electrode S2 of the switching TFT T2 is connected to the data line 151, and a switching drain electrode D2 of the switching TFT T2 is connected to the driving source electrode S1 of the driving TFT T1, and is also connected to the driving voltage line 152 via the operation control TFT T5. The switching TFT T2 is turned on according to a scan signal Sn received through the scanning line 121 to perform a switching operation of transmitting a data signal Dm transmitted to the data line 151 to the driving source electrode S1 of the driving TFT T1.

A compensation gate electrode G3 of the compensation TFT T3 is connected to the scanning line 121, a compensation source electrode S3 of the compensation TFT T3 is connected to the driving drain electrode D1 of the driving TFT T1 and is also connected to the pixel electrode of the organic light-emitting device OLED via the emission control TFT T6, and the compensation drain electrode D3 of the compensation TFT T3 is connected to the first electrode Cst1 of the capacitor Cst, a first initialization source electrode S4 of the first initialization TFT T4, and the driving gate electrode G1 of the driving TFT T1. The compensation TFT T3 is turned on according to scan signal Sn transmitted through the scanning line 121 to electrically connect the driving gate electrode G1 to the driving drain electrode D1 of the driving TFT T1 to make a diode connection of the driving TFT T1.

A first initialization gate electrode G4 of the first initialization TFT T4 is connected to the previous scanning line 122, and a first initialization drain electrode D4 of the first initialization TFT T4 is connected to a second initialization drain electrode D7 of the second initialization TFT T7 and the initialization voltage line 131. The first initialization source electrode S4 of the first initialization TFT T4 is connected to the first electrode Cst1 of the capacitor Cst, the compensation drain electrode D3 of the compensation TFT T3, and the driving gate electrode G1 of the driving TFT T1. The first initialization TFT T4 is turned on according to a previous scan signal Sn−1 received through the previous scanning line 121 to transmit an initialization voltage Vint to the driving gate electrode G1 of the driving TFT T1 so as to perform an initialization operation of initializing a voltage of the driving gate electrode G1 of the driving TFT T1.

The operation control gate electrode G5 of the operation control TFT T5 is connected to the emission control line 123, an operation control source electrode S5 of the operation control TFT T5 is connected to the driving voltage line 152, and the operation control drain electrode D5 of the operation control TFT T5 is connected to the driving source electrode S1 of the driving TFT T1 and the switching drain electrode D2 of the switching TFT T2.

The emission control gate electrode G6 of the emission control TFT T6 is connected to the emission control line 123, the emission control source electrode S6 of the emission control TFT T6 is connected to the driving drain electrode D1 of the driving TFT T1 and the compensation source electrode S3 of the compensation TFT T3, and the emission control drain electrode D6 of the emission control TFT T6 is electrically connected to the second initialization source electrode S7 of the second initialization TFT T7 and the pixel electrode of the organic light-emitting device OLED.

The operation control TFT T5 and the emission control TFT T6 are simultaneously turned on according to an emission control signal En received through the emission control line 123 such that a driving voltage ELVDD is transmitted to the organic light-emitting device OLED so that a driving current $I_{OLED}$ flows through the organic light-emitting device OLED.

The second initialization gate electrode G7 of the second initialization TFT T7 is connected to the previous scanning line 122, the second initialization source electrode S7 of the second initialization TFT T7 is connected to the drain electrode D6 of the emission control TFT T6 and the pixel electrode of the organic light-emitting device OLED, and the second initialization drain electrode D7 of the second initialization TFT T7 is connected to the first initialization drain electrode D4 of the first initialization TFT T4 and the initialization voltage line 131. The second initialization TFT T7 is turned on according to a previous scan signal Sn−1 received through the previous scanning line 122 to initialize the pixel electrode of the organic light-emitting device OLED.

While FIG. 3 illustrates an exemplary embodiment where the first initialization TFT T4 and the second initialization TFT T7 are connected to the previous scanning line 122, exemplary embodiments are not limited thereto. For instance, the first initialization TFT T4 may be connected to the previous scanning line 122 to be driven according to a previous scan signal Sn−1, and the second initialization TFT T7 may be connected to an additional signal line (for example, a subsequent scanning line) to be driven according to a signal transmitted to the additional signal line. In addition, locations of the source electrodes S1 through S7 and the drain electrodes D1 through D7 illustrated in FIG. 3 may be exchanged according to a transistor type (p-type or n-type).

An operation of each pixel PX according to some exemplary embodiments will now be described in more detail.

During an initialization period, when a previous scan signal Sn−1 is supplied through the previous scanning line 122, the first initialization TFT T4 is turned on according to the previous scan signal Sn−1, and the driving TFT T1 is initialized according to an initialization voltage Vint received through the initialization voltage line 131.

During a data programming period, when a scan signal Sn is supplied through the scanning line 121, the switching TFT T2 and the compensation TFT T3 are turned on according to the scan signal Sn. The driving TFT T1 is diode-connected by the turned-on compensation TFT T3, and is biased in a forward direction.

Then, a compensation voltage (Dm+Vth, where Vth is a (−) value), which is a voltage of a data signal Dm, which is supplied through the data line 151, and from which a threshold voltage Vth of the driving TFT T1 is taken, is applied to the driving gate electrode G1 of the driving TFT T1.

A driving voltage ELVDD and a compensation voltage Dm+Vth are applied to two ends of the capacitor Cst, and a charge corresponding to a voltage difference between the two ends is stored in the capacitor Cst.

During an emission period, the operation control TFT T5 and the emission control TFT T6 are turned on according to an emission control signal En supplied through the emission control signal 123. A driving current $I_{OLED}$ according to a voltage difference between a voltage of a gate electrode of the driving TFT T1 and a driving voltage ELVDD is generated, and the driving current $I_{OLED}$ is supplied to the organic light-emitting device OLED through the emission control TFT T6.

Figure 4:
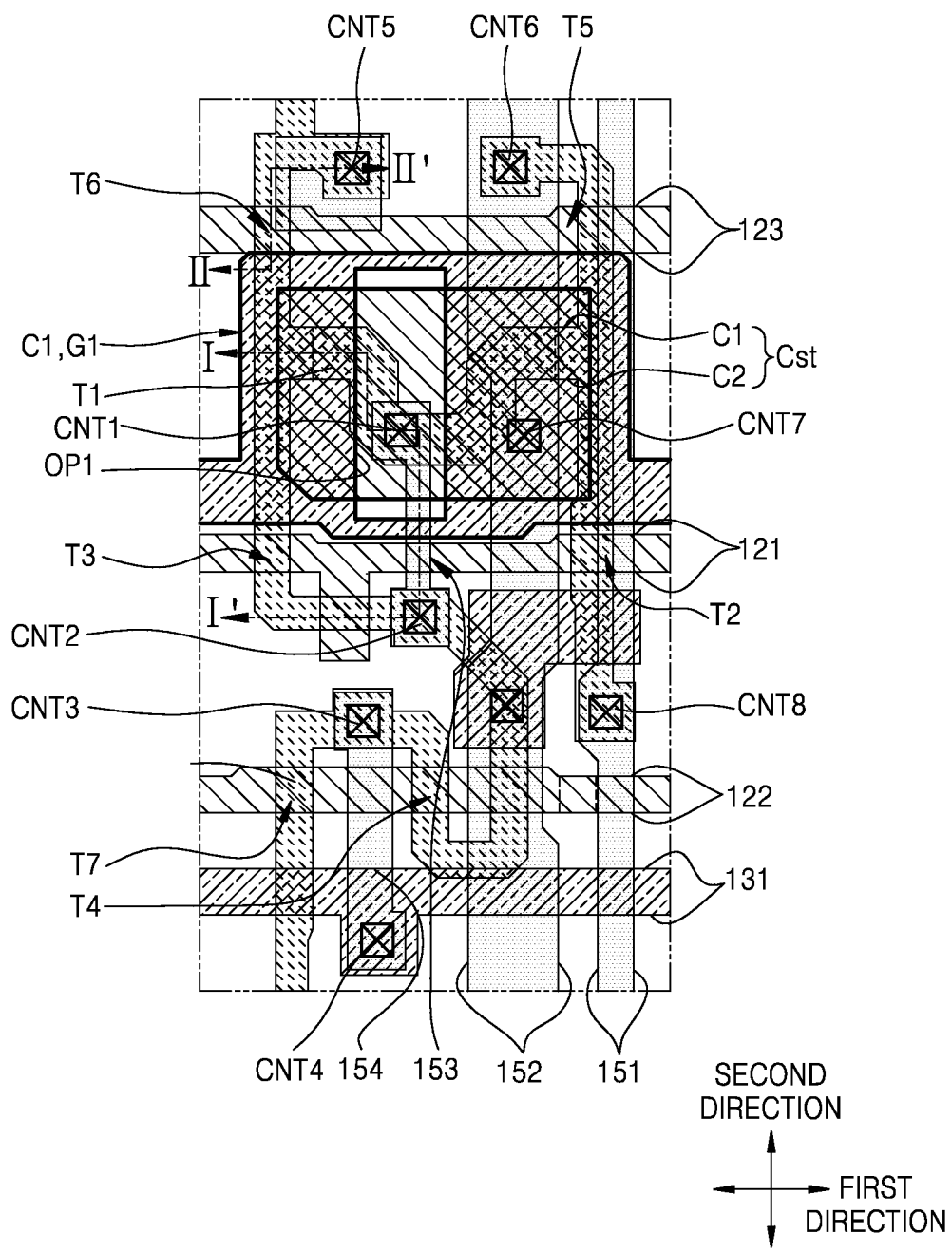
FIG. 4 is a schematic layout diagram illustrating locations of a plurality of thin film transistors and a capacitor included in a pixel circuit according to some exemplary embodiments.

FIG. 4 is a schematic layout diagram illustrating locations of a plurality of thin film transistors and a capacitor included in a pixel circuit according to some exemplary embodiments. FIGS. 5 through 8 are respectively schematic layout diagrams of elements such as the plurality of thin film transistors and the capacitor illustrated in FIG. 4 in various layers of an organic light-emitting display apparatus according to some exemplary embodiments. FIG. 9 is a cross-sectional view of FIG. 4 taken along sectional lines I-I' and II-II' according to some exemplary embodiments.

FIGS. 5 through 8 respectively illustrate arrangement of wirings, electrodes and semiconductor layers in each layer of the pixel circuit, and insulating layers may be between layers illustrated in FIGS. 5 through 8. For example, a first gate insulating layer 112 (see FIG. 9) may be between a layer illustrated in FIG. 5 and a layer illustrated in FIG. 6, and a second gate insulating layer 113 (see FIG. 10) may be between the layer illustrated in FIG. 6 and a layer illustrated in FIG. 7, and an interlayer insulating layer 114 (see FIG. 10) may be between the layer illustrated in FIG. 7 and a layer illustrated in FIG. 8. The layers illustrated in FIGS. 5 through 8 may be electrically connected to each other through contact holes defined in at least some of the insulating layers described above.

Figure 5:
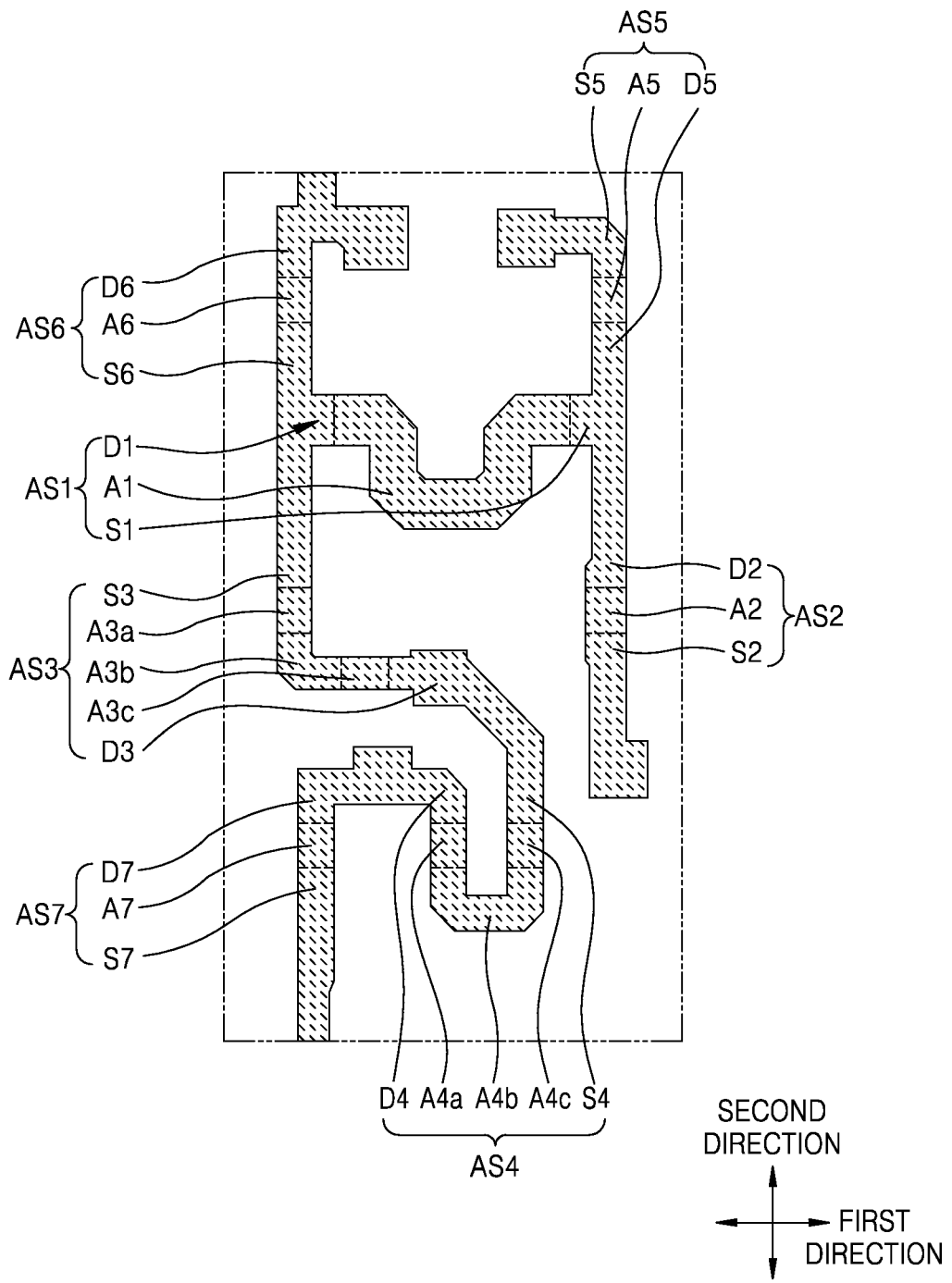
FIGS. 5, 6, 7, and 8 are respectively schematic layout diagrams of elements such as the plurality of thin film transistors and the capacitor illustrated in FIG. 4 in various layers of an organic light-emitting display apparatus according to some exemplary embodiments.

Referring to FIGS. 4, 5, and 9, semiconductor layers AS1 through AS7 of the driving TFT T1, the switching TFT T2, the compensation TFT T3, the first initialization TFT T4, the operation control TFT T5, the emission control TFT T6, and the second initialization TFT T7 are arranged in a same level and include a same material. For example, the semiconductor layers AS1 through AS7 may be formed of polycrystalline silicon.

The semiconductor layers AS1 through AS7 are arranged on a buffer layer 111 (see FIG. 9) on a substrate 110. The substrate 110 may be formed of a glass material, a metal material, or a plastic material, such as polyethylene terephthalate (PET), polyethylene naphthalate (PEN), or polyimide. The buffer layer 111 may include an oxide layer, such as a silicon oxide (SiOx) layer and/or a nitride layer, such as a silicon nitride (SiNx) layer.

The substrate 110 may include a glass material, a ceramic material, a metal material, or a flexible or bendable material. When the substrate 110 is flexible or bendable, the substrate 110 may include a polymer resin, such as at least one of polyethersulphone (PES), polyacrylate (PAR), polyetherimide (PEI), polyethylene naphthalate (PEN), polyethylene terephthalate (PET), polyphenylene sulfide (PPS), polyarylate, polyimide (PI), polycarbonate (PC), and cellulose acetate propionate (CAP). The substrate 110 may have a single-layer structure or a multi-layer structure of the above-described material(s), and the multi-layer structure may further include an inorganic layer. In some exemplary embodiments, the substrate 110 may have a structure of organic material/inorganic material/organic material.

The buffer layer 111 may enhance flatness of an upper surface of the substrate 110, and may include an inorganic material, such as a silicon oxide, a silicon nitride, and/or a silicon oxynitride.

A barrier layer (not shown) may be further included between the substrate 110 and the buffer layer 111. The barrier layer may prevent or minimize penetration of impurities from the substrate 110 or the like into the semiconductor layers AS1 through AS7. The barrier layer may include an inorganic material, such as an oxide or a nitride, or an organic material, or an organic-inorganic hybrid material, and may have a single-layer structure or a multi-layer structure of an inorganic material and an organic material.

A driving semiconductor layer AS1 of the driving TFT T1, a switching semiconductor layer AS2 of the switching TFT T2, a compensation semiconductor layer AS3 of the compensation TFT T3, a first initialization semiconductor layer AS4 of the first initialization TFT T4, an operation control semiconductor layer AS5 of the operation control TFT T5, an emission control semiconductor layer AS6 of the emission control TFT T6, and a second initialization semiconductor layer AS7 of the second initialization TFT T7 may be connected to each other, and be curved in various shapes.

The semiconductor layers AS1 through AS7 may include a channel region and a source region and a drain region respectively on opposing sides of the channel region. For example, the source region and the drain region may be doped with an impurity that may include an N-type impurity or a P-type impurity. The source region and the drain region respectively correspond to a source electrode and a drain electrode. Hereinafter, instead of "source electrode" or "drain electrode," the terms "source region" and "drain region" will be used.

The driving semiconductor layer AS1 includes a driving channel region A1 and a driving source region S1 and a driving drain region D1 respectively on both sides of the driving channel region A1. The driving semiconductor layer A1 has a curved shape so that the driving channel region A1 may be longer than other channel regions (e.g., channels regions A2 through A7). For example, as the driving semiconductor layer AS1 has a shape having multiple curved portions, like an omega shape or the letter "S," a long channel length may be provided in a narrow space. Due to a long length of the driving channel region A1, a driving range of a gate voltage applied to the driving gate electrode G1 is extended, thereby allowing precise control of gradation of light emitted from the organic light-emitting device OLED and higher display quality.

The switching semiconductor layer AS2 includes a switching channel region A2 and a switching source region S2 and a switching drain region S2 respectively on both sides of the switching channel region A2. The switching drain region S2 is connected to the driving source region S1.

The compensation semiconductor layer AS3 includes compensation channel regions A3a and A3c and a compensation source region S3 and a compensation drain region D3 respectively at opposing sides of both the compensation channel regions A3a and A3c. The compensation TFT T3 formed in the compensation semiconductor layer AS3 is a dual TFT and includes two compensation channel regions A3a and A3c, and a region A3b between the compensation channel regions A3a and A3c is an impurity-doped region, and locally corresponds to a source region of one of the dual TFT and a drain region of the other.

The first initialization semiconductor layer AS4 includes first initialization channel regions A4a and A4c and a first initialization source region S4 and a first initialization drain region D4 respectively at opposing sides of both the first initialization channel regions A4a and A4c. The first initialization TFT T4 formed in the first initialization semiconductor layer AS4 is a dual TFT having two first initialization channel regions A4a and A4c, and a region A4b between the first initialization channel regions A4a and A4c is an impurity-doped region, and corresponds locally to a source region of one of the dual TFT and to a drain region of the other.

The operation control semiconductor layer AS5 includes an operation control channel region A5 and an operation control source region S5 and an operation control drain region D5 respectively on opposing sides of the operation control channel region A5. The operation control drain region D5 may be connected to the driving source region S1.

The emission control semiconductor layer AS6 includes an emission control channel region A6, and an emission control source region S6 and an emission control drain region D6 that are respectively at opposing sides of the emission control channel region A6. The emission control source region S6 may be connected to the driving drain region D1.

The second initialization semiconductor layer AS7 includes a second initialization channel region A7, and a second initialization source region S7 and a second initialization drain region D7 that are respectively at opposing sides of the second initialization channel region A7.

A first gate insulating layer 112 is located on the semiconductor layers AS1 to AS7. The first gate insulating layer 112 may include an inorganic material including an oxide or a nitride. For example, the first gate insulating layer 112 may include at least one of silicon oxide (SiO$_2$), silicon nitride (SiN$_x$), silicon oxynitride (SiON), aluminum oxide (Al$_2$O$_3$), titanium oxide (TiO$_2$), tantalum oxide (Ta$_2$O$_5$), hafnium oxide (HfO$_2$), and zinc oxide (ZnO$_2$), or the like.

According to some exemplary embodiments, the semiconductor layers AS1 to AS7 of each of the plurality of pixels PX are separately formed from each other. For example, semiconductor layers AS1 to AS7 of a first pixel PX1 are formed apart from semiconductor layers AS1 to AS7 of a second pixel PX2.

Figure 6:
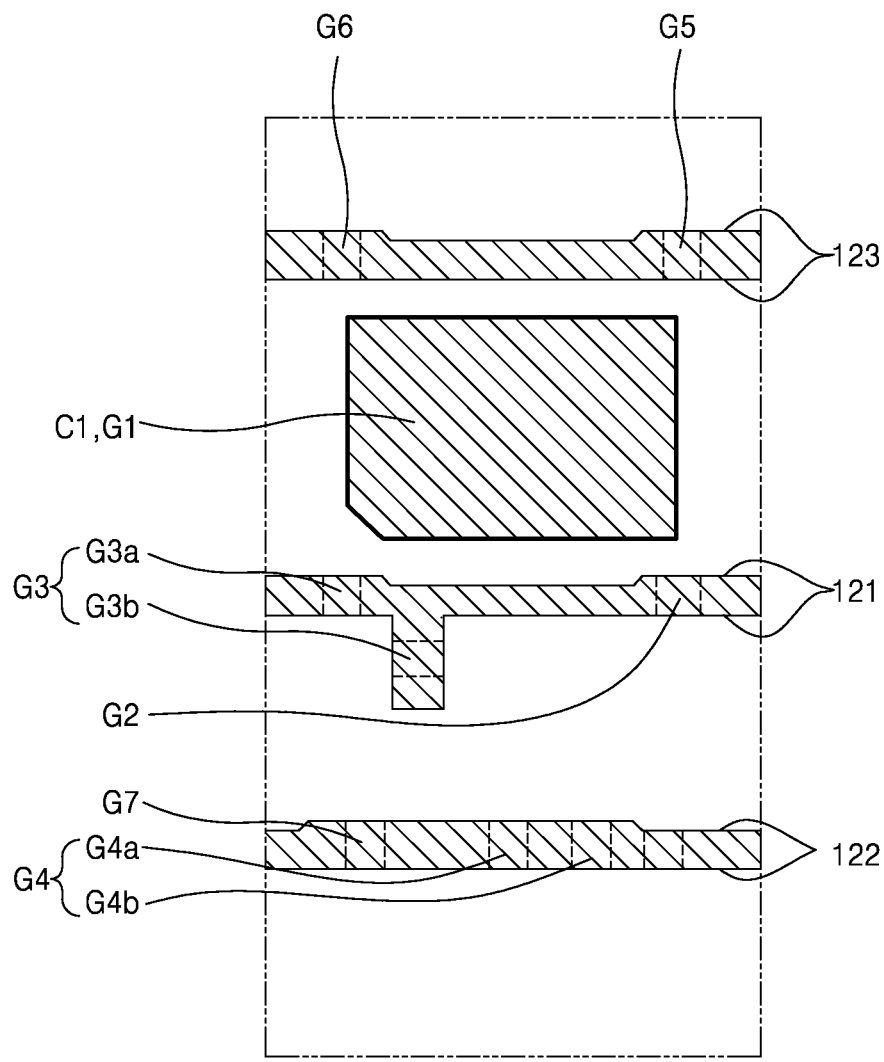
Figure 6:
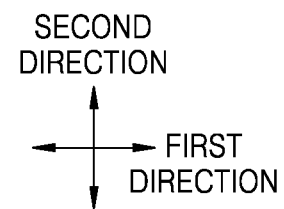

Referring to FIGS. 4, 6, and 9, a scanning line 121, a previous scanning line 122, an emission control line 123, and a driving gate electrode G1 are arranged on the first gate insulating layer 112. The scanning line 121, the previous scanning line 122, the emission control line 123, and the driving gate electrode G1 are arranged on a same layer and include a same material. For example, the scanning line 121, the previous scanning line 122, the emission control line 123, and the driving gate electrode G1 may include molybdenum (Mo), copper (Cu), titanium (Ti), or the like, and may have a single-layer or multi-layer structure.

The driving gate electrode G1 is an island type electrode and is arranged to overlap the driving channel region A1 of the driving semiconductor layer AS1. The driving gate electrode G1 may function not only as a gate electrode of the driving TFT T1, but also as a bottom electrode C1 of the capacitor Cst. That is, the driving gate electrode G1 and the bottom electrode C1 may be regarded as a single element.

A portion or a protruding portion of the scanning line 121, the previous scanning line 122, and the emission control line 123 corresponds to gate electrodes G3 to G7 of the TFTs T2 to T7.

Regions of the scanning line 121 overlapping the switching channel region A2 and the compensation channel regions A3a and A3c respectively correspond to the switching gate electrode G2 and the compensation gate electrodes G3a and G3b. Regions of the previous scanning line 122 overlapping the first initialization channel regions A4a and A4c and the second initialization channel region A7 respectively correspond to the first initialization gate electrodes G4a and G4b and the second initialization gate electrode G7. Regions of the emission control line 123 overlapping the operation control channel region A5 and the emission control channel region A6 respectively correspond to the operation control gate electrode G5 and the emission control gate electrode G6.

The compensation gate electrodes G3a and G3b are a dual gate electrode including a first compensation gate electrode G3a and a second compensation gate electrode G3b, and may prevent or reduce generation of a leakage current.

A second gate insulating layer 113 is located on the scanning line 121, the previous scanning line 122, the emission control line 123, and the driving gate electrode G1. The second gate insulating layer 113 may include an inorganic material including an oxide or a nitride. For example, the second gate insulating layer 113 may be formed of at least one of silicon oxide (SiO$_2$), silicon nitride (SiNx), silicon oxynitride (SiON), aluminum oxide (Al$_2$O$_3$), titanium oxide (TiO$_2$), tantalum oxide (Ta$_2$O$_5$), hafnium oxide (HfO$_2$), and zinc oxide (ZnO$_2$), or the like.

Figure 7:
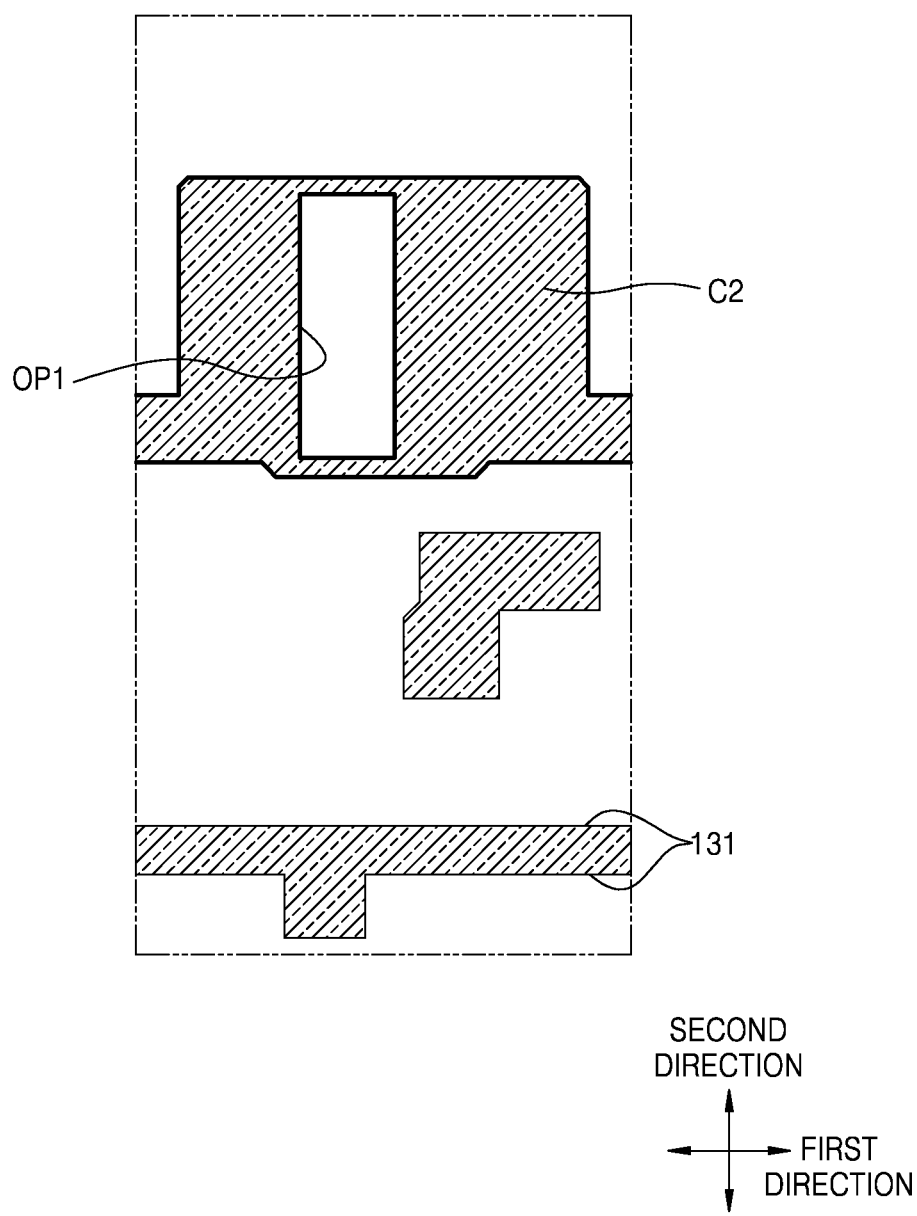

Referring to FIGS. 4, 7, and 9, a top electrode C2 of the capacitor Cst and the initialization voltage line 131 are located on the second gate insulating layer 113.

The top electrode C2 of the capacitor Cst and the initialization voltage line 131 are disposed on a same layer and may include a same material. For example, the top electrode C2 of the capacitor Cst and the initialization voltage line 131 may include a conductive material including molybdenum (Mo), copper (Cu), titanium (Ti), and/or the like, and may have a single-layer or multi-layer structure including the aforementioned material.

The top electrode C2 of the capacitor Cst is arranged to overlap with the bottom electrode C1 and has an opening OP1. The opening OP1 is formed by removing a portion of the top electrode C2, and may have a single closed curve shape. Here, a single closed curve means a closed figure having a starting point and an ending point that meet when a point is drawn on a straight line or a curve, such as a polygon or a circle. The top electrode C2 having the opening OP1 may be regarded as having a donut shape.

The second gate insulating layer 113 arranged between the top electrode C2 and the bottom electrode C1 may serve as a dielectric layer of the capacitor Cst. Widths of the top electrode C2 in a first direction and in a second direction may be greater than widths of the bottom electrode C1 in the first direction and in the second direction. Both ends of the bottom electrode C1 in the second direction may be exposed by the opening OP1 defined in the top electrode C2.

According to some exemplary embodiments, through the capacitor Cst including the top electrode C2 having the opening OP1, even when overlay deviation and deviation in critical dimensions occur during a manufacturing process of an organic light-emitting display apparatus, a variation in capacitance may be minimized. This will be described later with reference to FIGS. 10 and 11.

An interlayer insulating layer 114 is located on the top electrode C2 of the capacitor Cst and the initialization voltage line 131. The interlayer insulating layer 114 may include an inorganic material including an oxide or a nitride. For example, the interlayer insulating layer 114 may be formed of at least one of silicon oxide (SiO$_2$), silicon nitride (SiNx), silicon oxynitride (SiON), aluminum oxide (Al$_2$O$_3$), titanium oxide (TiO$_2$), tantalum oxide (Ta$_2$O$_5$), hafnium oxide (HfO$_2$), and zinc oxide (ZnO$_2$), or the like.

Figure 8:
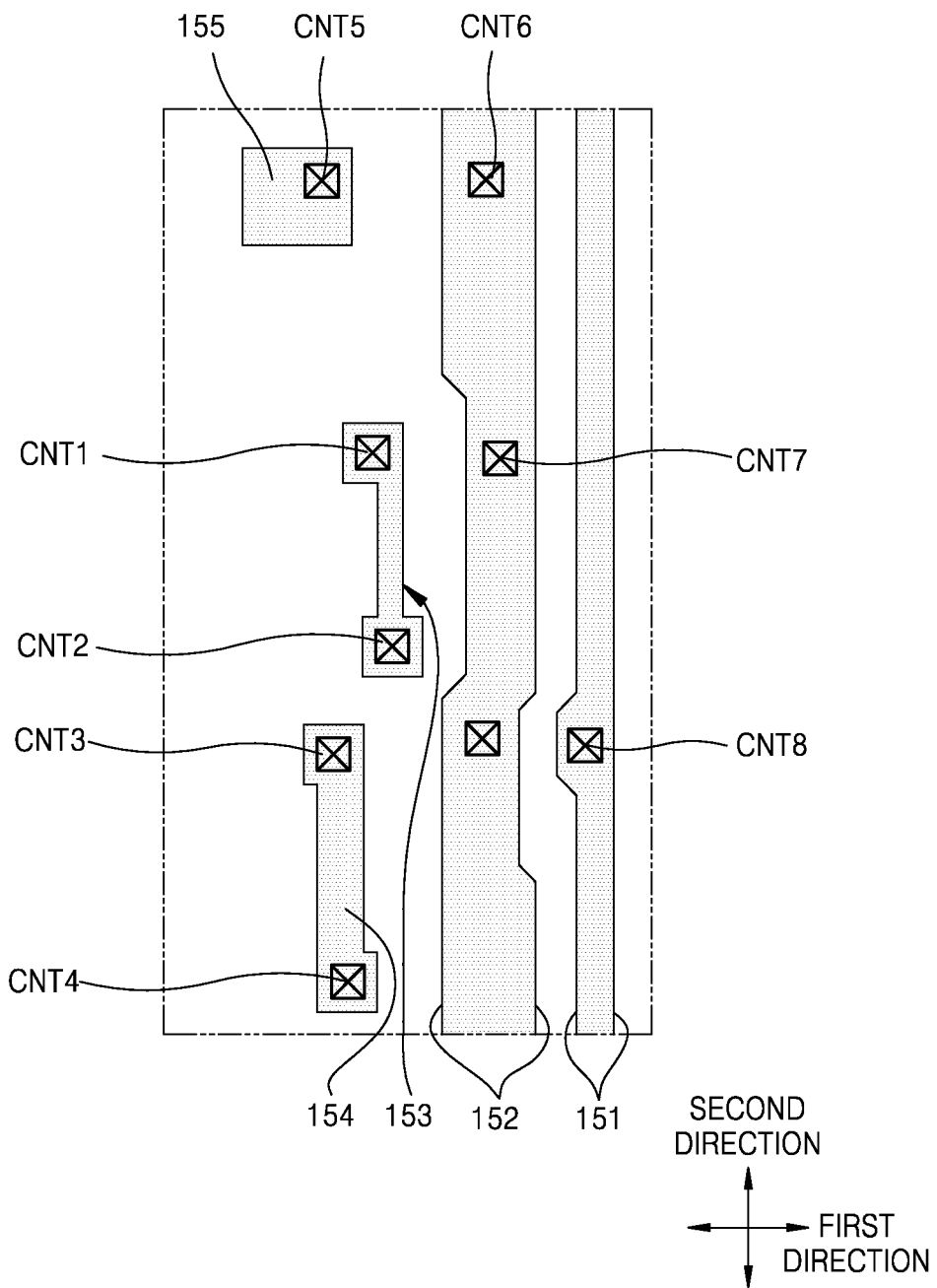
Figure 9:
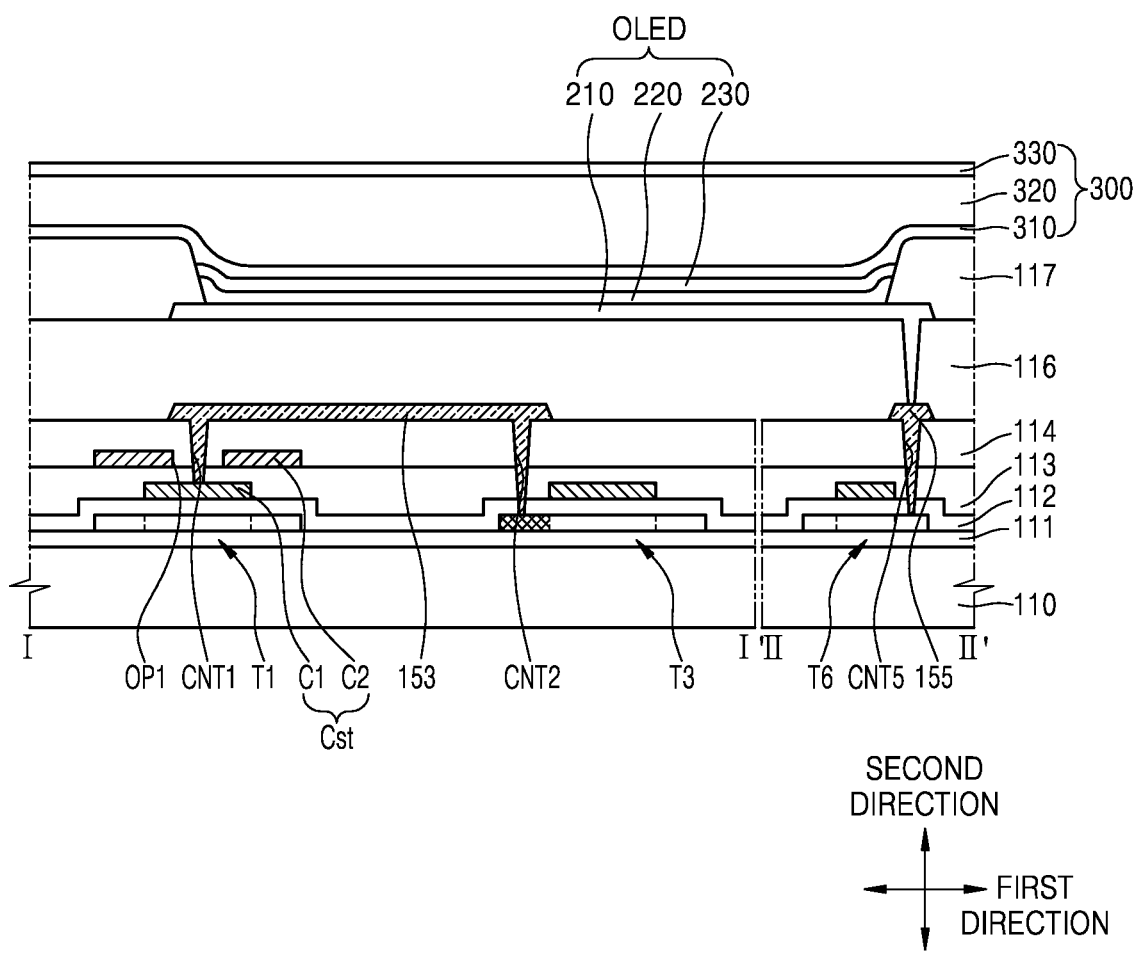
FIG. 9 is a cross-sectional view of FIG. 4 taken along sectional lines I-I' and II-II' according to some exemplary embodiments.

Referring to FIGS. 4, 8, and 9, a second connection wiring 150 extending in the second direction is arranged on the interlayer insulating layer 114. The second connection wiring 150 is insulated from a first connection wiring 140 via the interlayer insulating layer 114. The second connection wiring 150 may include a data line 151, a driving voltage line 152, a first node connection line 153, a second node connection line 154, and a connection electrode 155.

The data line 151, the driving voltage line 152, the first node connection line 153, the second node connection line 154, and the connection electrode 155 are arranged on a same layer and include a same material. For example, the data line 151, the driving voltage line 152, the first node connection line 153, the second node connection line 154, and the connection electrode 155 may be formed of a highly conductive material, such as a metal or a conductive oxide.

The data line 151 is connected to the switching source region S2 of the switching TFT T2 through a contact hole CNT8 passing through the interlayer insulating layer 114, the second gate insulating layer 113, and the first gate insulating layer 112. The data line 151 may connect a plurality of pixels arranged in the second direction.

The driving voltage line 152 is connected to the operation control source region S5 of the operation control TFT T5 through a contact hole CNT6 passing through the interlayer insulating layer 114, the second gate insulating layer 113, and the first gate insulating layer 112.

In addition, the driving voltage line 152 is connected to the top electrode C2 of the capacitor Cst through a contact hole CNT7 passing through the interlayer insulating layer 114. The driving voltage line 152 may connect a plurality of pixels arranged in the second direction.

The first node connection line 153 connects the driving gate electrode G1 and the compensation drain region D3 of the compensation TFT T3 through contact holes CNT1 and CNT2. The driving gate electrode G1, which is an island type, may be electrically connected to the compensation TFT T3 by the first node connection line 153. As the driving gate electrode G1 functions as the bottom electrode C1 of the capacitor Cst, the first node connection line 153 may be regarded as being connected to the bottom electrode C1.

A first end of the first node connection line 153 and the bottom electrode C1 are connected through the contact hole CNT1. The contact hole CNT1 may be arranged in the opening OP1 of the top electrode C2 to connect the first end of the first node connection line 153 to the bottom electrode C1. The opening OP1 may have a larger size than the contact hole CNT1 so that the contact hole CNT1 may not contact the top electrode C2.

A second end of the first node connection line 153 and the compensation TFT T3 are connected via a contact hole CNT2. The contact hole CNT2 is formed to penetrate the interlayer insulating layer 114, the second gate insulating layer 113, and the first gate insulating layer 112 such that the second end of the first node connection line 153 is connected to the drain region D3 of the compensation TFT T3.

The second node connection line 154 transmits an initialization voltage Vint initializing the driving TFT T1 and a pixel electrode 210. The second node connection line 154 is connected to the first and second initialization TFTs T4 and T7 through a contact hole CNT3 passing through the interlayer insulating layer 114 and the first gate insulating layer 112, and is connected to the initialization voltage line 131 through a contact hole CNT4 passing through the interlayer insulating layer 114.

The connection electrode 155 may be connected to the emission control drain region D6 of the emission control TFT T6 through a contact hole CNT5 passing through the interlayer insulating layer 114, the second gate insulating layer 113, and the first gate insulating layer 112. The connection electrode 155 may be connected to the pixel electrode 210 to transmit a signal that is applied through the emission control TFT T6 to the pixel electrode 210.

A planarization layer 116 is located above the data line 151, the driving voltage line 152, the first node connection line 153, the second node connection line 154, and the connection electrode 155. The planarization layer 116 may include an organic material, such as at least one of acryl, benzocyclobutene (BCB), polyimide (PI), and hexamethyldisiloxane (HMDSO). Alternatively, the planarization layer 116 may include an inorganic material. The planarization layer 116 may approximately planarize an upper portion of a protection layer covering the TFTs T1 through T7. The planarization layer 116 may have a single-layer or multi-layer structure.

The organic light-emitting device OLED having the pixel electrode 210, an opposite electrode 230, and an intermediate layer 220 between the pixel electrode 210 and the opposite electrode 230 and including an emissive layer may be located on the planarization layer 116.

The pixel electrode 210 is connected to the connection electrode 155 through a contact hole defined in the planarization layer 116, and is connected to the emission control drain region D6 of the emission control TFT T6 via the connection electrode 155.

A pixel defining layer 117 may be arranged on the planarization layer 116. The pixel defining layer 117 has an opening corresponding to each of pixels or sub-pixels, that is, an opening exposing at least a central portion of the pixel electrode 210 to thereby define pixels. The pixel defining layer 117 may increase a distance between an edge of the pixel electrode 210 and the opposite electrode 230 above the pixel electrode 210 to thereby prevent an arc or the like at the edge of the pixel electrode 210. The pixel defining layer 117 may be formed of an organic material, such as polyimide or HMDSO.

The intermediate layer 220 of the organic light-emitting device OLED may include a low molecular material or a polymer material. When a low molecular material is included, the intermediate layer 220 may have a structure in which a hole injection layer (HIL), a hole transport layer (HTL), an organic emission layer (EML), an electron transport layer (ETL), an electron injection layer (EIL), and the like are stacked in a single-layer or multi-layer structure, and may include various organic materials, such as at least one of copper phthalocyanine (CuPc), N,N'-Di(naphthalene-1-yl)-N,N'-diphenyl-benzidine (NPB), and tris-8-hydroxyquinoline aluminum (Alq3). These layers may be formed using a vacuum deposition method; however, any suitable process (es) may be utilized.

When the intermediate layer 220 includes a polymer material, the intermediate layer 220 may typically have a structure including a hole transport layer (HTL) or an organic emission layer (EML). The hole transport layer (HTL) may include poly(3,4-ethylenedioxythiophene) (PEDOT), and the emission layer may include a polymer material, such as a poly-phenylenevinylene (PPV)-based material or a polyfluorene-based material. The intermediate layer 220 may be formed using, for example, a screen printing method, an inkjet printing method, or a laser induced thermal imaging (LITI) method.

The intermediate layer 220 is not limited to the above, and may have various structures. For instance, the intermediate layer 220 may include a single layer covering a plurality of pixel electrodes 210 or layers patterned to respectively correspond to a plurality of pixel electrodes 210.

The opposite electrode 230 is arranged on the display area DA, and may be arranged to cover the display area DA as illustrated in FIG. 9. That is, the opposite electrode 230 may be formed integrally with a plurality of organic light-emitting devices (OLEDs) and correspond to a plurality of pixel electrodes 210.

As the organic light-emitting device OLED may be easily damaged by moisture or oxygen from the outside, an encapsulating layer 300 may cover and protect the organic light-emitting device OLED. The encapsulating layer 300 may cover the display area DA and extend out of the display area DA. The encapsulating layer 300 may include a first inorganic encapsulating layer 310, an organic encapsulating layer 320, and a second inorganic encapsulating layer 330.

The first inorganic encapsulating layer 310 covers the opposite electrode 230 and may include a ceramic, a metal oxide, a metal nitride, a metal carbide, a metal oxynitride, an indium oxide ($In_2O_3$), a tin oxide ($SnO_2$), an indium tin oxide (ITO), a silicon oxide, a silicon nitride, and/or a silicon oxynitride, or the like. Other layers, such as a capping layer (not shown) may also be optionally between the first inorganic encapsulating layer 310 and the opposite electrode 230. The first inorganic encapsulating layer 310 is formed along a structure under the first inorganic encapsulating layer 310, and thus, a top surface of the first inorganic encapsulating layer 310 is not flat.

The organic encapsulating layer 320 covers the first inorganic encapsulating layer 310. Unlike the first inorganic encapsulating layer 310, the organic encapsulating layer 320 may have a substantially flat top surface. For example, the top surface of the organic encapsulating layer 320 may be substantially flat at a portion corresponding to the display area DA. The organic encapsulating layer 320 may be formed of at least one material selected from the group consisting of acryl, metacrylic, polyester, polyethylene, polypropylene, polyethylene terephthalate, polyethylene naphthalate, polycarbonate, polyimide, polyethylene sulfonate, polyoxymethylene, polyarylate, and HMDSO.

The second inorganic encapsulating layer 330 covers the organic encapsulating layer 320 and may be formed of a ceramic, a metal oxide, a metal nitride, a metal carbide, a metal oxynitride, an indium oxide ($In_2O_3$), a tin oxide ($SnO_2$), an indium tin oxide (ITO), a silicon oxide, a silicon nitride, and/or a silicon oxynitride.

As the encapsulating layer 300 includes the first inorganic encapsulating layer 310, the organic encapsulating layer 320, and the second inorganic encapsulating layer 330, according to this multi-layer structure of the encapsulating layer 300, even when a crack occurs in the encapsulating layer 300, the crack may be prevented from being connected between the first inorganic encapsulating layer 310 and the organic encapsulating layer 320 or between the organic encapsulating layer 320 and the second inorganic encapsulating layer 330. Accordingly, formation of a path through which moisture, oxygen, or the like from the outside penetrates into the display area DA may be prevented or minimized.

Although not illustrated, a spacer for preventing mask imprinting may be further included on the pixel defining layer 117, and various functional layers, such as a polarizing layer reducing external light reflection, a black matrix, a color filter, and/or a touch screen layer having a touch electrode may be included on the encapsulating layer 300.

Figure 10:
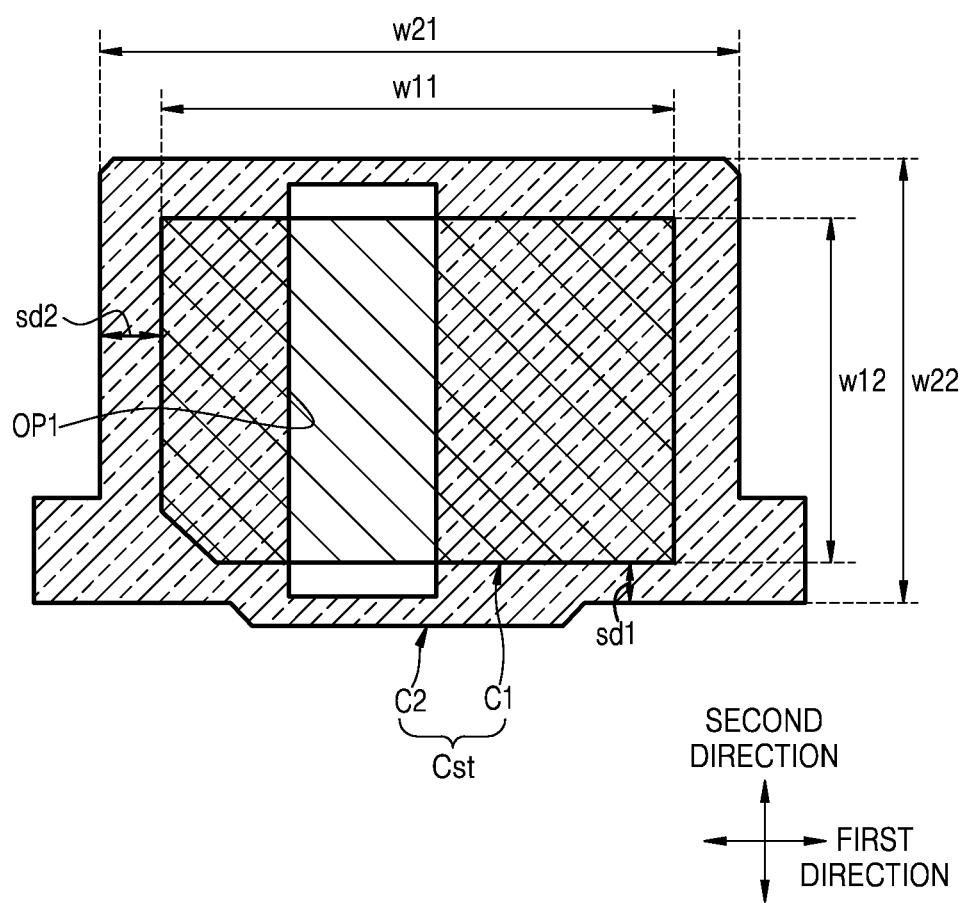
FIG. 10 is a plan view illustrating a bottom electrode and a top electrode of the capacitor illustrated in FIG. 4 according to some exemplary embodiments.
Figure 11:
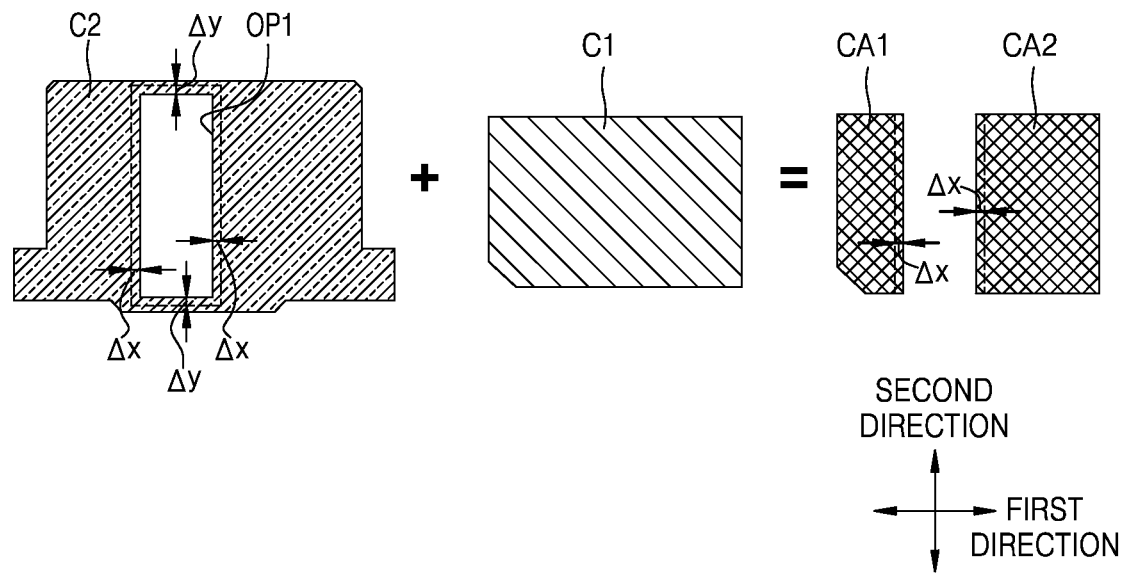
FIG. 11 illustrates an overlapping area of the bottom electrode and the top electrode of the capacitor of FIG. 4 according to some exemplary embodiments.
Figure 12:
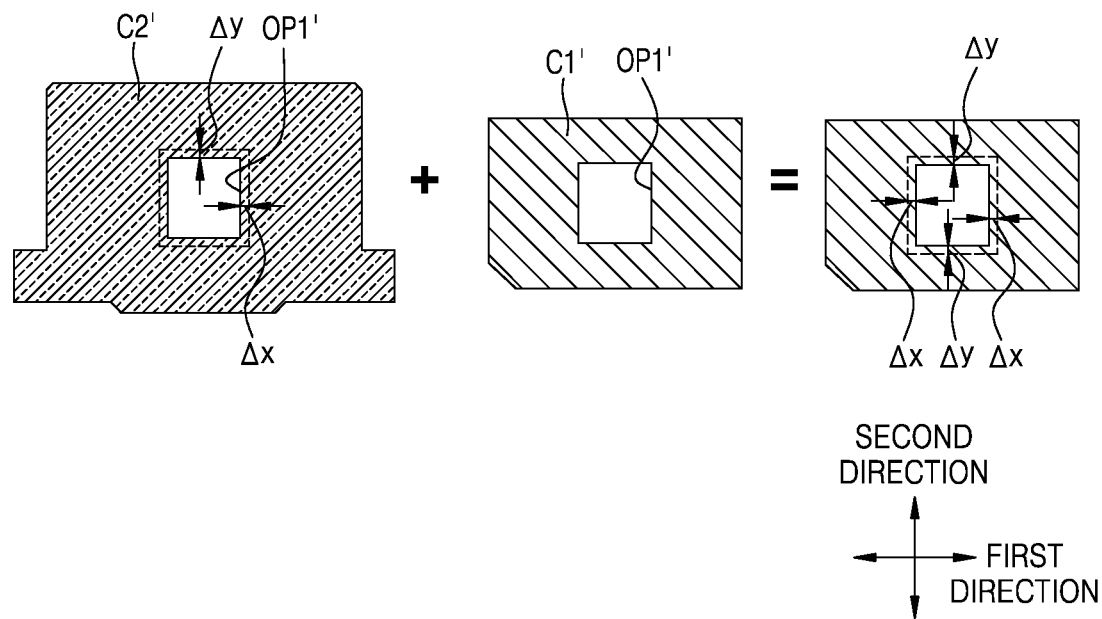
FIG. 12 illustrates a comparative example with respect to the exemplary embodiment(s) of FIG. 10.

FIG. 10 is a plan view illustrating a bottom electrode and a top electrode of the capacitor illustrated in FIG. 4 according to some exemplary embodiments. FIG. 11 illustrates an overlapping area of the bottom electrode and the top electrode of the capacitor of FIG. 4 according to some exemplary embodiments. FIG. 12 illustrates a comparative example with respect to the exemplary embodiment(s) of FIG. 10.

FIG. 10 is a plan view illustrating the bottom electrode C1 and the top electrode C2 of the capacitor Cst included in the organic light-emitting device illustrated in FIG. 4. FIG. 11 illustrates an overlapping area of the bottom electrode C1 and the top electrode C2 of the capacitor Cst of the organic light-emitting device of FIG. 4. FIG. 12 is a schematic plan view illustrating an overlapping area of a bottom electrode C1' and a top electrode CT of a capacitor according to a comparative example with respect to the exemplary embodiment(s) of FIG. 10.

Referring to FIG. 10, when viewed in a plan view, an edge of the top electrode C2 of the capacitor Cst is outwardly spaced apart from an edge of the bottom electrode C1 to surround the bottom electrode C1. The edge of the top electrode C2 is spaced apart from the edge of the bottom electrode C1 by at least a first spacing distance sd1 with respect to the second direction, and the edge of the top electrode C2 with respect to the first direction is spaced apart from the edge of the bottom electrode C1 by at least a second spacing distance sd2. A width W21 of the top electrode C2 in the first direction is greater than a width W11 of the bottom electrode C1 in the first direction, and a width W22 of the top electrode C2 in the second direction is greater than a width W12 of the bottom electrode C1 in the second direction.

The first spacing distance sd1 and the second spacing distance sd2 may be designed by considering a maximum overlay deviation that may occur during one or more manufacturing processes. Here, when two or more layers that overlap each other are formed and each layer is shifted in upward, downward, leftward, and rightward directions, overlapping areas of the shifted layers are different from an overlapping area as initially designed, and such a difference in the overlapping areas is referred to as an overlay deviation. The overlay deviation may occur due to misalignment between a substrate and a mask or misalignment between a substrate and an exposure apparatus when forming a conductive layer on the substrate and performing a photolithography process thereon.

According to some exemplary embodiments, the edge of the top electrode C2 is outwardly spaced apart from the edge of the bottom electrode C1, and thus, even if the top electrode C2 is shifted relative to the bottom electrode C1 with respect to a designed value, an overlapping area between the bottom electrode C1 and the top electrode C2 may be kept constant. That is, the capacitor Cst according to various exemplary embodiments may provide a constant capacitance despite overlay deviation. In addition, according to various exemplary embodiments, the top electrode C2 has an opening OP1 having a single closed curve shape, and the overlapping area of the top electrode C2 and the bottom electrode C1 is divided by the opening OP1 into two areas, that is, a first area CA1 and a second area CA2.

In FIG. 10, the opening OP1 is formed to have a long width in the second direction, thereby exposing both ends of the bottom electrode C1 arranged in the second direction. Accordingly, the overlapping area of the top electrode C2 and the bottom electrode C1 may be divided into two regions, that is, the first area CA1 and the second area CA2.

In FIG. 10, the opening OP1 has a rectangular shape having a longer width in the second direction, but exemplary embodiments are not limited thereto, and various modifications may be made. For example, the opening OP1 may have an round edge, and a width of the opening OP1 in the first direction may not be constant.

A capacitance of the capacitor Cst is determined by Equation 1 below. In Equation 1, C represents a capacitance, ε represents a dielectric constant, A1 and A2 represent areas of the first area CA1 and the second area CA2, respectively, and d represents a distance between the bottom electrode C1 and the top electrode C2.

$$C = \varepsilon(A1+A2)/d \qquad \text{Equation 1}$$

That is, the capacitance of the capacitor Cst according to some exemplary embodiments is determined by the dielectric constant £ of the second gate insulating layer 113, the distance d between the bottom electrode C1 and the top electrode C2, and an area A1+A2 of the overlapping area of the bottom electrode C1 and the top electrode C2. Therefore, when the area A1+A2 of the overlapping area changes, the capacitance changes.

Accordingly, if an overlapping area varies depending on a variation in a threshold, a capacitance of the capacitor varies. The deviation in a threshold refers to a deviation in dimensions that are hard to be controlled through an etching process. The threshold deviation may occur when patterning is performed by a photolithography process and an etching process, depending on the size of photoresist due to a photolithography process, etching conditions, and the like.

According to some exemplary embodiments, variation in capacitance may be minimized even if deviation in a threshold occurs.

If an opening OP1' in the top electrode C2' is disposed inside the bottom electrode C1' such that the top electrode C2' and the bottom electrode C1' are not divided by the opening OP1', a capacitance value may be sensitively varied by a deviation in a threshold.

For example, the opening OP1' that is further etched than designed values by Δx in the first direction and Δy in the second direction may be formed due to a deviation in a threshold. In this case, the overlapping area is affected by both Δx and Δy.

However, if the overlapping area is divided by the opening OP1 as illustrated in FIG. 11 according to various exemplary embodiments, the overlapping area is affected only by Δx. Thus, a variation in the capacitance of the capacitor Cst included in the organic light-emitting display apparatus according to various exemplary embodiments may not be sensitive to process errors.

Figure 13:
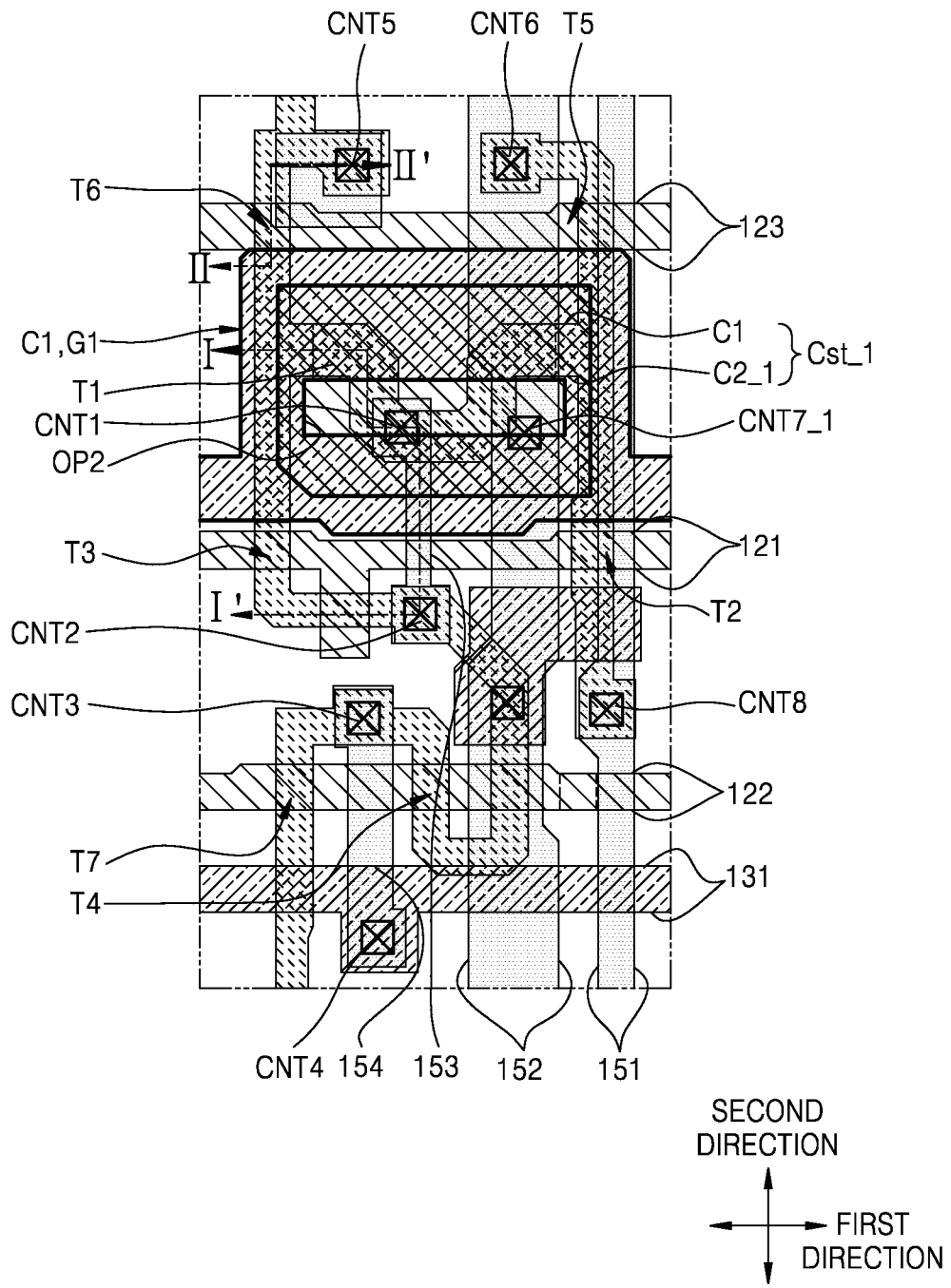
FIG. 13 is a schematic layout diagram illustrating locations of a plurality of thin film transistors and a capacitor included in a pixel circuit according to some exemplary embodiments.
Figure 14:
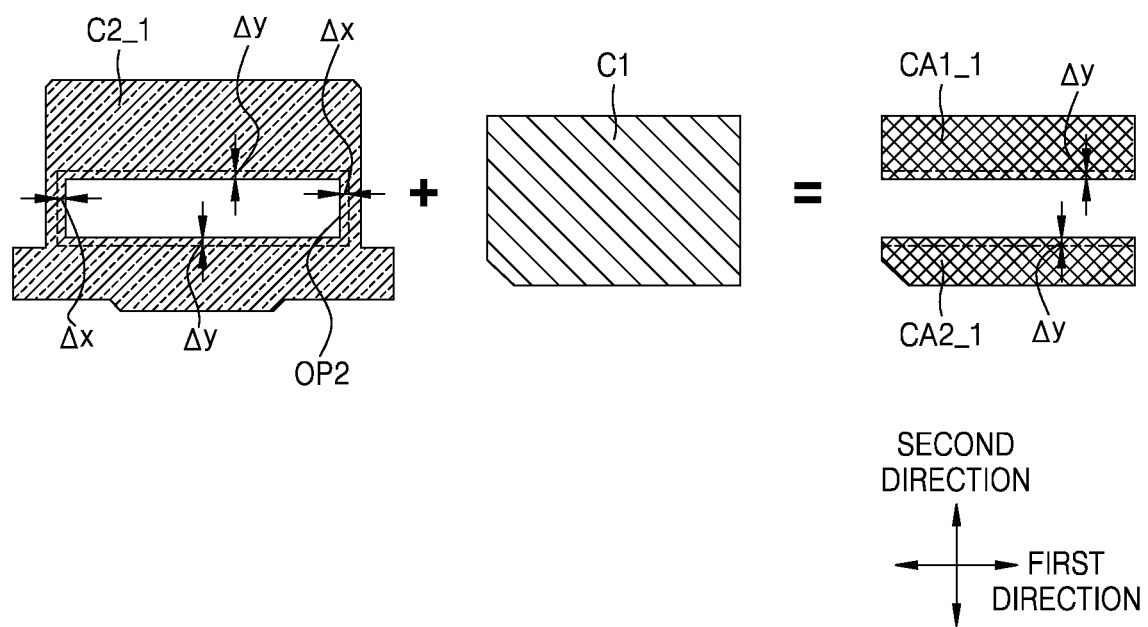
FIG. 14 illustrates an overlapping area of a bottom electrode and a top electrode of the capacitor of FIG. 13 according to some exemplary embodiments.

FIG. 13 is a schematic layout diagram illustrating locations of a plurality of thin film transistors and a capacitor included in a pixel circuit according to some exemplary embodiments. FIG. 14 illustrates an overlapping area of a bottom electrode and a top electrode of the capacitor of FIG. 13 according to some exemplary embodiments. In the exemplary embodiments of FIGS. 13 and 14, like reference numerals as those in FIG. 4 denote like elements, and thus, repeated description thereof will be omitted.

Referring to FIGS. 13 and 14, the capacitor Cst_1 included in the organic light-emitting display apparatus includes a bottom electrode C1 and a top electrode C2_1 that includes an opening OP2 having a single closed curve shape.

A contact hole CNT1 passing through the interlayer insulating layer 114 and the second gate insulating layer 113 is formed in the opening OP2 so as to be connected to the bottom electrode C1. The opening OP2 is greater in size than the contact hole CNT1 so that the contact hole CNT1 may not contact the top electrode C2_1.

A first end of the first node connection line 153 may be connected to the bottom electrode C1 through the contact hole CNT1. A second end of the first node connection line 153 may be connected to the drain region D3 of the compensation TFT T3 through the contact hole CNT2 passing through the interlayer insulating layer 114, the second gate insulating layer 113, and the first gate insulating layer 112.

The top electrode C2_1 may be connected, through a contact hole CNT7_1, to a driving voltage line 152 through which a driving voltage is transmitted.

When viewed in a plan view, an edge of the top electrode C2_1 is outwardly spaced apart from an edge of the bottom electrode C1 and surrounds the bottom electrode C1. A width of the top electrode C2_1 in the first direction is greater than a width of the bottom electrode C1 in the first direction, and a width of the top electrode C2_1 in the second direction is greater than a width of the bottom electrode C1 in the second direction.

Due to these characteristics, an overlapping area of the bottom electrode C1 and the top electrode C2_1 may be kept constant despite overlay deviation.

In addition, according to various exemplary embodiments, the top electrode C2_1 has an opening OP2 having a single closed curve shape, and the overlapping area of the top electrode C2_1 and the bottom electrode C1 is divided by the opening OP2 into two areas, that is, a first area CA1_1 and a second area CA2_1.

A width of the opening OP2 is longer in the first direction than the second direction, thereby exposing both ends of the bottom electrode C1 arranged in the first direction. Accordingly, the overlapping area of the top electrode C2_1 and the bottom electrode C1 may be divided into two areas, that is, the first area CA1_1 and the second area CA2_1.

Referring to FIGS. 13 and 14, while the opening OP2 has a rectangular shape having a longer width in the second direction, exemplary embodiments are not limited thereto, and other various modifications may be made. For example, the opening OP2 may have a round corner, or a width of the opening OP2 in the second direction may not be constant.

Due to these characteristics, the overlapping area of the bottom electrode C1 and the top electrode C2_1 of the capacitor Cst_1 according to various exemplary embodiments is affected only by Δy. Thus, a variation in capacitance of the capacitor Cst included in the organic light-emitting display apparatus according to various exemplary embodiments may not be sensitive to process errors.

According to various exemplary embodiments, in the capacitor included in the organic light-emitting display apparatus, as an overlapping area of a top electrode and a bottom electrode is divided by an opening portion of the top electrode, even when overlay deviation and deviation of critical dimensions occur during the manufacture of an organic light-emitting display apparatus, variation in capacitance may be minimized. However, the scope of the present disclosure is not limited by the above effects.

Although certain exemplary embodiments and implementations have been described herein, other embodiments and modifications will be apparent from this description. Accordingly, the inventive concepts are not limited to such embodiments, but rather to the broader scope of the accompanying claims and various obvious modifications and equivalent arrangements as would be apparent to one of ordinary skill in the art.

What is claimed is:

1. A thin film transistor array substrate comprising:
   a substrate;
   at least one thin film transistor on the substrate;
   a capacitor on the substrate, the capacitor comprising:
     a bottom electrode on the substrate;
     a top electrode overlapping the bottom electrode, the top electrode comprising an opening having a single closed curve shape; and
     a dielectric layer between the bottom electrode and the top electrode;
   an interlayer insulating layer covering the capacitor; and
   a node connection line on the interlayer insulating layer and electrically connecting the capacitor to the at least one thin film transistor,
   wherein:
     an overlapping area of the bottom electrode and the top electrode is divided by the opening into two separate areas; and
     when viewed in a plan view, the opening exposes opposing edges of the bottom electrode.

2. The thin film transistor array substrate of claim 1, wherein the opening divides the bottom electrode into a total of three areas, the three areas being a first area adjacent to a first side of the opening, a second area adjacent to a second side of the opposing first side of the opening, and a third area exposed by the opening.

3. The thin film transistor array substrate of claim 1, wherein, when viewed in the plan view, an edge of the top electrode is outwardly spaced apart from an edge of the bottom electrode, the edge of the top electrode surrounding the edge of the bottom electrode.

4. The thin film transistor array substrate of claim 1, further comprising:
a node contact hole in the opening and passing through the interlayer insulating layer and the dielectric layer,
wherein a first end of the node connection line is connected to the bottom electrode through the node contact hole.

5. The thin film transistor array substrate of claim 4, wherein, when viewed in the plan view, a size of the opening is greater than a size of the node contact hole.

6. The thin film transistor array substrate of claim 1, further comprising:
a scanning line extending in a first direction; and
a data line extending in a second direction crossing the first direction,
wherein the opening has a rectangular shape comprising a longer side in the first direction.

7. The thin film transistor array substrate of claim 1, further comprising:
a scanning line extending in a first direction; and
a data line extending in a second direction crossing the first direction,
wherein the opening has a rectangular shape comprising a longer side in the second direction.

8. The thin film transistor array substrate of claim 1, further comprising:
a driving voltage line in a same layer as the node connection line,
wherein a driving voltage is transmitted via the driving voltage line, and
wherein the top electrode is connected to the driving voltage line through a contact hole.

9. The thin film transistor array substrate of claim 1, further comprising:
a driving thin film transistor overlapping the capacitor,
wherein the bottom electrode forms a driving gate electrode of the driving thin film transistor, the bottom electrode and the driving gate electrode being equivalent.

10. The thin film transistor array substrate of claim 9, wherein a driving semiconductor layer of the driving thin film transistor has a curved shape.

11. The thin film transistor array substrate of claim 9, wherein:
the at least one thin film transistor comprises a compensation thin film transistor;
a first end of the node connection line is connected to the bottom electrode; and
a second end of the node connection line is connected to a drain region of the compensation thin film transistor.

12. An organic light-emitting display apparatus comprising:
a substrate;
a driving voltage line on the substrate, the driving voltage line being configured to transmit a driving voltage;
a scanning line extending on the substrate in a first direction;
a data line insulated from the scanning line and extending in a second direction crossing the first direction;
a pixel circuit electrically connected to the driving voltage line, the scanning line, and the data line, the pixel circuit comprising at least one thin film transistor and a capacitor, the capacitor comprising:
a bottom electrode on the substrate;
a top electrode overlapping the bottom electrode, the top electrode comprising an opening having a single closed curve shape; and
a dielectric layer between the bottom electrode and the top electrode;
an interlayer insulating layer covering the capacitor; and
a node connection line arranged on the interlayer insulating layer and electrically connecting the capacitor to the at least one thin film transistor,
wherein:
an overlapping area of the bottom electrode and the top electrode is divided by the opening into two separate regions and
when viewed in a plan view, the opening exposes opposing edges of the bottom electrode.

13. The organic light-emitting display apparatus of claim 12, wherein the opening divides the bottom electrode into a total of three areas, the three areas being a first area adjacent to a first side of the opening, a second area adjacent to a second side of the opening opposing the first side of the opening, and a third area exposed by the opening.

14. The organic light-emitting display apparatus of claim 12, wherein, when viewed in the plan view, an edge of the top electrode is outwardly spaced apart from an edge of the bottom electrode, the edge of the top electrode surrounding the edge of the bottom electrode.

15. The organic light-emitting display apparatus of claim 12, further comprising:
a node contact hole in the opening and passing through the interlayer insulating layer and the dielectric layer,
wherein a first end of the node connection line is connected to the bottom electrode through the node contact hole.

16. The organic light-emitting display apparatus of claim 15, wherein a size of the opening is greater than a size of the node contact hole.

17. The organic light-emitting display apparatus of claim 12, wherein the opening extends in the first direction or the second direction.

18. The organic light-emitting display apparatus of claim 12, wherein:
the driving voltage line is in a same layer as the node connection line; and
the top electrode is connected to the driving voltage line through a contact hole.

19. The organic light-emitting display apparatus of claim 12, wherein:
the at least one transistor comprises a driving thin film transistor overlapping the capacitor; and
the bottom electrode forms a driving gate electrode of the driving thin film transistor, the bottom electrode and the driving gate electrode being a single unit.

20. The organic light-emitting display apparatus of claim 19, wherein:
the at least one thin film transistor further comprises a compensation thin film transistor;
a first end of the node connection line is connected to the bottom electrode; and
a second end of the node connection line is connected to a drain region of the compensation thin film transistor.

* * * * *